(12) United States Patent
Rather et al.

(10) Patent No.: US 7,531,371 B2
(45) Date of Patent: May 12, 2009

(54) MULTISURFACED MICRODEVICE SYSTEM ARRAY AND A METHOD OF PRODUCING THE ARRAY

(76) Inventors: John D. G. Rather, 102 Windsong La., Oak Ridge, TN (US) 37832; Gregory W. Auner, 16284 Aldrich Ct., Livonia, MI (US) 48154

( * ) Notice: Subject to any disclaimer, the term of this patent is extended or adjusted under 35 U.S.C. 154(b) by 166 days.

(21) Appl. No.: 11/361,730

(22) Filed: Feb. 21, 2006

(65) Prior Publication Data
US 2007/0194442 A1    Aug. 23, 2007

(51) Int. Cl.
*H01L 21/00* (2006.01)
(52) U.S. Cl. .............................. 438/24; 438/34; 438/50; 438/73
(58) Field of Classification Search .................. 438/24, 438/34, 50, 73
See application file for complete search history.

(56) References Cited

U.S. PATENT DOCUMENTS

| | | | |
|---|---|---|---|
| 5,424,245 A | 6/1995 | Gurtler et al. | |
| 5,923,403 A | 7/1999 | Jain | |
| 6,184,579 B1 | 2/2001 | Sasov | |
| 2005/0113004 A1* | 5/2005 | Brandes | 451/54 |
| 2006/0226524 A1* | 10/2006 | Chen et al. | 257/680 |

OTHER PUBLICATIONS

Micro-Sensor Array Platform: Low-Cost, Very Low-Power Wireless Sensor Array Platform, Oak Ridge National Laboratory, 2 pages.
Double-Sided PCBs, Tat Chun Printed circuit Board Co. Ltd., Global Sources, Jan. 31, 2006, 2 pages.

* cited by examiner

*Primary Examiner*—Richard A. Booth
(74) *Attorney, Agent, or Firm*—Brooks Kushman P.C.

(57) ABSTRACT

A multisurfaced microdevice system array is produced from a wafer formed of semiconductor substrate material. Sensing, controlling and actuating microdevices are fabricated at specific location on both sides of the wafer, and the wafer is diced. Each die thus created is then formed into a multisurfaced, multifaced structure having outer and inner faces. The multifaced structure and the microdevices form a standardized microdevice system, and cooperatively combined microdevice systems form a microdevice system array. Communication of energy and data to and between microdevices on each and other microdevice systems of the microdevice system array is provided by energy transferring devices including electric conductors for transferring electric energy, ultrasound emitters and receivers for transferring acoustic energy, and electromagnetic energy emitters and receivers for transferring electromagnetic energy.

7 Claims, 5 Drawing Sheets

MULTISURFACED MICRODEVICE SYSTEM ARRAY AND A METHOD OF PRODUCING THE ARRAY

BACKGROUND OF THE INVENTION

1. Field of the Invention

The present invention relates generally to microdevices and more particularly to individual multisurfaced microdevice systems that are independently operable for small-scale applications and that are intercommunicatively assembleable to form microdevice system arrays for large scale applications.

2. Background Art

Current sensing and control systems tend to be complex and expensive. Typical systems include mechanical or laser gyros integrated with sensitive accelerometers and timing subsystems on circuit cards with many microprocessors and signal processing circuitry. Although some key components, particularly accelerometers, have been miniaturized in solid state microelectromechanical system (MEMS) devices, there does not exist a universal, complete and versatile sensing, actuating and controlling "system-on-a-chip" in a very small, low-power package that effectively lends itself to a plethora of diverse applications.

Furthermore, although solid-state microprocessors, sensors, micro-electromechanical systems and energy transmitters, for example, light-emitting diodes (LED's), have undergone revolutionary development for three decades, almost all these diverse devices are fabricated on nearly flat, two-dimensional substrates. A large majority of such devices are fabricated on crystalline silicon wafers having a thickness of approximately 2 millimeters. It is unusual for such devices to have surface feature relief exceeding approximately 100 microns in depth or height.

Large investments have been made in existing microcircuit production facilities. Large-scale production is done by expensive robotic machines in highly automated clean-room environments. Typically, some hundred different operations must be performed on each semiconductor wafer surface; and the wafers must be precisely indexed and transported between some twenty machines. An improvement in this system can be realized by fabricating microdevices on both surfaces of wafers; and a need for such an improvement exists, especially given the rapidly expanding demand for more versatile and highly integrated microdevices. A major retooling of existing production lines, however, would be expensive and time consuming.

To facilitate such an improvement without major retooling, two primary fabrication concerns must be addressed: precision-made microdevices already fabricated on one surface of a wafer must not be damaged during the process of fabricating microdevices on its opposite surface, and the disposition and registration of the microdevices on opposing surfaces must be precise.

The present invention addresses such problems. It also provides technology that facilitates, by using techniques such as convergent assembly and biomimetics, the manufacture of extendable arrays of many identical elements finding application in, for example, sensing, optics, guidance, stabilization, motility and robotics that function together for large-scale applications. The performance of the new technology equals or exceeds that of previous ad hoc subsystems while also providing reductions in size, energy consumption, cost and complexity of application-oriented systems. Moreover, much of the present invention can be fabricated using present technology, thus further reducing cost and fabrication time.

SUMMARY OF THE INVENTION

An object of the present invention is to provide a multisurfaced microdevice system array having components that are multidimensional at large scales and to provide a method for producing cofunctioning arrays. The array is readily extendable and includes many identical elements that are universally applicable and that can function cooperatively within large-scale applications including large families of precision machines, robotic devices, astronomical telescopes and guided vehicles. The elements include sensing, controlling and actuating microdevices that equal or exceed the performance of previous ad hoc subsystems while providing increases in speed, precision and the number of functional dimensions and reductions in size, weight, energy consumption, cost and complexity.

In carrying out the foregoing object, the multisurfaced microdevice system array of the present invention includes a plurality, that is, more than one, of substrates, each having a first and a second surface. At least one of the substrates is semiconductive, and a plurality of sensing, controlling and actuating microdevices are disposed at locations on at least one of the surfaces of each substrate. At least one of the substrates extends from another substrate to form a multisurfaced structure having a multifaced configuration including at least two outer faces and at least two inner faces. The plurality of substrates and the plurality of microdevices form a microdevice system.

A plurality of the microdevice systems are cooperatively combined to form a multisurfaced microdevice system array. The microdevice systems of the array have the capability of communicating operating energy and data to at least one other microdevice system. The array provides economical and efficient redundancies of microdevices to perform a variety of functions, some of which require specific orientations provided by angular dispositions of the surfaces of the multifaced microdevice systems.

The plurality of microdevice systems in a specific microdevice system array comprise a standardized and universally applicable complement of microdevices to provide the economical and efficient redundancies of microdevices to facilitate their use in a variety of applications. Each microdevice system preferably comprises at least one microprocessor.

Energy transferring apparatuses are included for transferring energy from a source of energy to operate, and to communicate data to and between, the microdevices on each and other microdevice systems of the microdevice system array. The energy transferring devices include such elements as micromechanical linkages, fluidic ducts, waveguides, electric conductors, ultrasound emitters and receivers, and electromagnetic energy emitters and receivers.

The objects, features and advantages of the present invention are readily apparent from the following detailed description of the best mode for carrying out the invention when taken in connection with the accompanying drawings.

DETAILED DESCRIPTION OF THE PREFERRED EMBODIMENTS

Figure 1:
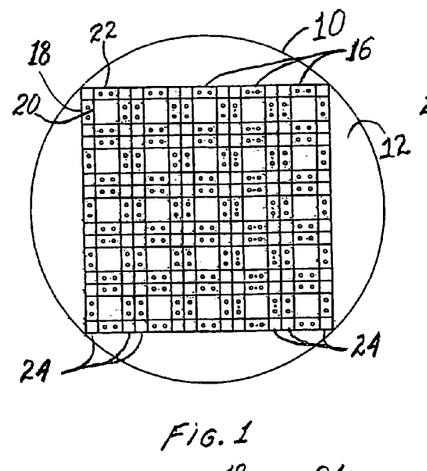
FIG. 1 is a plan view of a semiconductor wafer showing a layout of individual dice.
Figure 2:
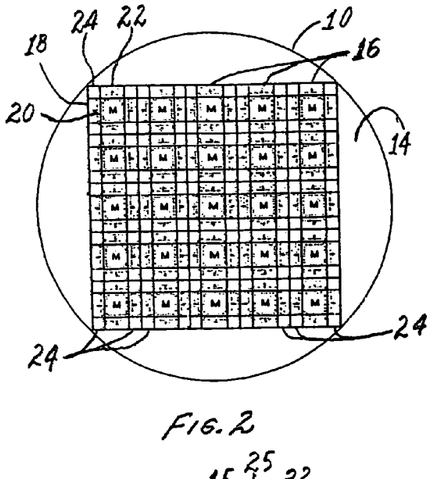
FIG. 2 is an opposite view of the semiconductor wafer of FIG. 1.

FIG. 1 illustrates a plan view of a semiconductor wafer 10, which has a first surface, generally indicated by the reference numeral 12. FIG. 2 illustrates an opposite view of the wafer 10, which has a second surface, generally indicated by the reference numeral 14. The first surface 12 and the second surface 14 of the wafer 10 show individual dice 16 arranged in rows and columns of five each. Each die 16 is represented by a square 18. FIGS. 1 and 2 illustrate how dice 16 can be located on a wafer 10 to produce, economically and efficiently, substrates with which to fabricate microdevice systems 37 (FIGS. 5 and 6) for a preferred embodiment of the present invention. The dice 16 used to form microdevice systems 37 in this embodiment include square substrates 20 shown bordered on all sides by rectangular substrates 22. Each die 16 also includes four, small, square corner portions representing unmodified "lands," or fixing areas, 24 that facilitate securing the wafer 10 to a work stage (not shown) during certain fabrication operations.

Figure 3:
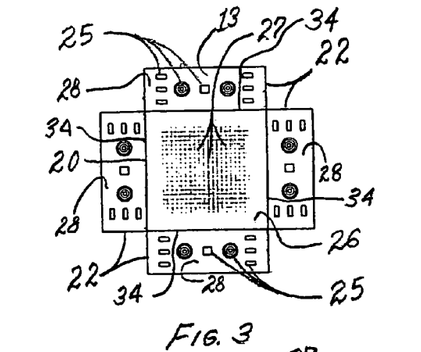
FIG. 3 is a plan view of a representative individual die of FIG. 1.
Figure 4:
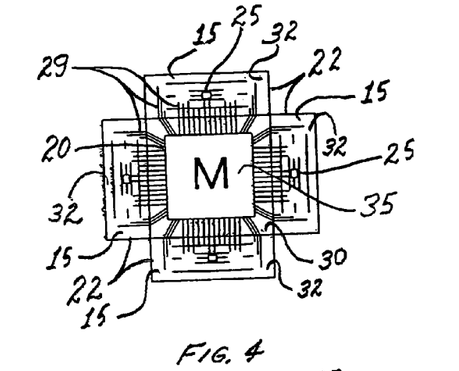
FIG. 4 is an opposite view of the die of FIG. 3.

FIGS. 3 and 4 are enlarged, opposite views of individual dice 16 shown by FIGS. 1 and 2, respectively. FIG. 3 shows a first surface 26 of the square substrate 20 and first surfaces 28 of the rectangular substrates 22. Symbols 25 are representative of various electrical, mechanical, electromechanical, electromagnetic, acoustic and optical microdevices and are shown located at both surfaces 28 and 32 of the rectangular substrates 22. Lines 27 are representative of such elements as electric circuitry and transducer components and are shown located at the first surface 26 of the square substrate 20. FIG. 4 shows a second surface 30 of the square substrate 20 and second surfaces 32 of the rectangular substrates 22. A symbol M indicates a representative location of a microprocessor 35, and lines 29 are representative of electric circuitry on the second surface 30 of the square substrate 20 and on the second surface 32 of the rectangular substrates 22.

Figure 5:
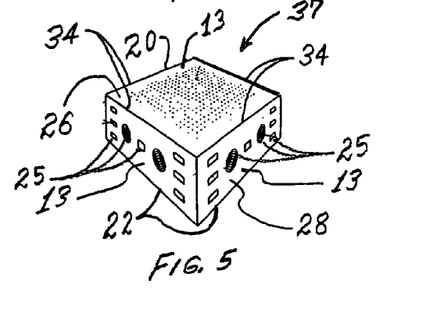
FIG. 5 is a perspective view of a folded configuration of the die of FIG. 3.
Figure 6:
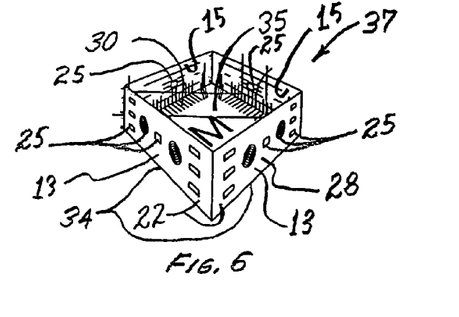
FIG. 6 is an inverted perspective view of the die of FIG. 5.

FIGS. 5 and 6 are perspective views of the dice 16 of FIGS. 3 and 4, respectively, shown with the rectangular substrates 22 extending from edges 34 of the square substrate 20 at an angle. The angle shown is 90 degrees and establishes the formation of a three-dimensional, rectangular prism, which is a preferred embodiment of the present invention. The rectangular prism and the microdevices 25 attached to it form a microdevice system, generally indicated by the reference numeral 37. Other angles are used to form structures having other configurations such as those shown by FIGS. 7A through 11B. Such structures and the microdevices 25 attached to them form microdevice systems, generally indicated by the reference numerals 40, 46, 52, 58 and 64, respectively, and represent additional preferred embodiments of the present invention. Outer faces of the structures are generally defined as being those having planes forming dihedral angles of more than 180 degrees with contiguous planes. Inner surfaces of the structures are generally defined as being those having planes forming dihedral angles of less than 180 degrees with contiguous planes.

The microdevices 25 are fabricated at locations on both outer and inner faces 13 and 15, respectively. They have a root mean square linear displacement accuracy within 75 nanometers and preferably within 50 nanometers, and they have a root mean square angular displacement accuracy within 75 nanoradians and preferably within 50 nanoradians. The registration of the microdevices 25 located at the inner faces 15 and of the microdevices 25 located oppositely at respective outer faces 13 is accurate to within 0.10 millimeter and preferably to within 0.05 millimeter. The accuracy of placement facilitates the alignment of vias, or openings, extending into substrates 20 and 22 to expose microdevice contacts. It also facilitates the transfer of energy through empty space and through the substrates 20 and 22 to operate, energize and communicate data to other microdevices 25 on each and other microdevice systems of the microdevice system array. A plurality of energy transferring apparatuses are included for transferring energy from a source of energy to operate, and to communicate data to and between, the microdevices 25. The energy transferring devices include such elements as electric conductors for transferring electric energy, ultrasound emitters and receivers for transferring acoustic energy, and electromagnetic energy emitters and receivers, including wired and wireless, radio frequency, infrared and light-emitting diodes (LED's) and receptors, for transferring electromagnetic energy.

The microdevices 25 shown by FIGS. 3 through 6 include, but are not limited to including, such items as sensors, controllers and actuators, and have the capability of operating as a macro-integrated precision system. Sensors, for example, include, but are not limited to including, such items as light-sensing charge-coupled devices (CCD's), accelerometers, mechanical gyros, laser gyros and acoustic, angular rate, directional flow, attitude, electromagnetic radiation, position, distance, pressure, speed, temperature and dynamically stabilizing sensors.

Controllers, for example, include, but are not limited to including, servo controllers, motion controllers, proportional-integral-derivative (PID) controllers, variable frequency controllers, microstepping controllers and microprocessors. Internal sensors provide local autonomous control data, and digital signal processors integrate external sensor inputs of all types to increase the precision of overall systems control. Also, as shown by FIGS. 4 and 6, the second surface 30 of the square substrate 20, for example, preferably includes, but is not limited to including, a microprocessor 35.

Actuators, for example, include, but are not limited to including, motivators such as piezoelectric devices, comb drives and micromotors. The energy transferring apparatuses, for example, include, but are not limited to including, such elements as micromechanical linkages, fluidic ducts, electric conductors, contacts and plugs; electromagnetic and acoustic emitters and receivers; and electromagnetic waveguides capable of directing electromagnetic radiation linearly and curvilinearly. Electric conductors, for example, include, but are not limited to including, microwires, metallic and polymer conductors; electromagnetic energy transferring apparatuses include, for example, but not limited to including, emitters and receivers for transferring electromagnetic energy having frequencies within the infrared, optical and radio frequency spectra.

Optical waveguides find application, for example, in energy and data transmission, in optical device coupling, and as gain media in waveguide lasers. They have advantages including a high transmission rate and a substantial immunity from electrical and magnetic disturbances, from crosstalk, and from interception. They produce no parasitic radiation to disturb nearby systems. They are also low in weight and physical dimensions and do not require amplification over reasonably large distances. High-frequency waveguides find application in directing and coupling high-frequency electromagnetic radiation.

Microdevice systems, such as that 37 shown by FIGS. 5 and 6, have many applications. These include, but are not limited to including, navigation, guidance, stabilization, timing, robotics, light sensing, beam splitting, beam steering, holography, dynamic optics, and multifocal optical trains. Such microdevice systems 37 are also invaluable for surveillance, exploration and various operations in inaccessible and hazardous locations, and they are ideally suited for use with autonomous-robotic and human-guided vehicles for land, sea, air and space deployment. A preferred application is fast-moving, hopping and running machines for the clandestine delivery of intelligence devices and/or ordinance in battlefield environments. Other preferred applications include robotic devices for transportation, free-space functional performance and production-line operational functions. Medical applications include research in prosthetic replacement of damaged human vestibular elements such as cochleae and semicircular, inner-ear canals. Other applications include remote control of robotic and stereotactic devices and adaptive optical systems.

An example of an adaptive optical system having 200,000 identical reflective elements is defined and described in U.S. Pat. No. 4,825,062, titled Extendable Large Aperture Phased Array Mirror System, and dated Apr. 25, 1989. The mirror segments of the system are cooperatively configured to receive an incoming electromagnetic beam. In response to signals from a sensor indicative of wavefront distortion, relative to an ideal wavefront, in the beam, a control apparatus displaces a plurality of segment actuators to configure the mirror segments to generate an outgoing conjugate phase electromagnetic beam.

Other examples include dynamic optics having the capability of generating active interference effects that apply to the generation of real-time holographic images, variable and multifocal optical trains and high-throughput beam splitters. Implementing such applications requires many identical microdevices, each having an optical surface and multiple surfaces having sensing and actuating microdevices and preferably at least one microprocessor and signal processing circuitry. A microdevice is spaced apart from adjacent, identical microdevices by gaps of approximately 10 to 100 micrometers to facilitate sensing their relative positions and to actuate adjacent microdevices so that their optical surfaces are precisely positioned to enable an entire microdevice system array of hundreds or thousands of identical microdevices to function as a single optical macrodevice. Those skilled in the art to which the subject matter pertains will recognize that the optical elements so described would greatly benefit from the new production methods of the present invention.

The location and state vector of any moving object can, in principal, be determined and controlled using data obtained by starting from a defined initial point in seven-dimensional phase space (viz., three velocity, three spatial and one temporal components) and integrating all accelerations with respect to inertial space. This is a traditional way of approaching the design of inertial guidance systems. In such systems, small errors accumulate, leading to a need to recalibrate periodically by using external such references as terrestrial landmarks, stars, or the Global Position Satellite (GPS) system. More recently developed systems use differential GPS and/or environmental doppler observations to achieve great accuracy in guidance. All motile animals, on the other hand, tend to integrate accelerations only for short periods, consistent with ad hoc muscle command and control while simultaneously integrating all real-time sensory inputs. The microdevice systems of the present invention capitalize upon all available information to provide compatible and beneficial means to facilitate the latter procedures of very frequent updating and recalibration. The general class of all vehicles that are intrinsically unstable but stabilizable by controlling all degrees of freedom are thus potential beneficiaries of the present invention.

At least one of the multisurfaced structures of the microdevice systems is formed of a semiconductor substrate. Such substrates are commonly formed of crystalline silicon (Si), gallium arsenide (GaAs) or germanium (Ge); and the materials are appropriately doped with specific impurities to enhance their conductivity and to establish required n-type and p-type properties. As will be appreciated by those skilled in the art, however, there are other semiconducting materials, among them, aluminum nitride (AlN), gallium nitride (GaN) and sapphire ($Al_2O_3$), that can also be used for various applications depending on operational requirements and economic considerations.

Figure 7A:
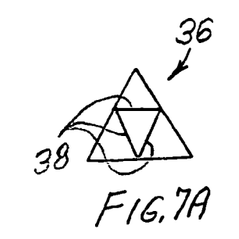
FIG. 7A is a plane diagram, or net, in which edges of faces of a die that is foldable into a tetrahedral-shaped structure are shown.
Figure 7B:
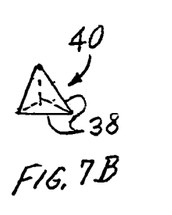
FIG. 7B is a perspective view, shown partially with hidden lines, of the folded tetrahedral-shaped structure of FIG. 7A.
Figure 8A:
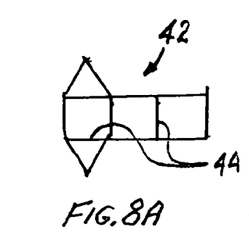
FIG. 8A is a plane diagram, or net, in which edges of faces of a die that is foldable into a triangular-prism-shaped structure are shown.
Figure 8B:
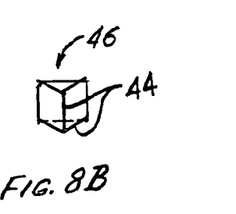
FIG. 8B is a perspective view, shown partially with hidden lines, of the folded triangular-prism-shaped structure of FIG. 8A.

As mentioned, examples of additional structural configurations are shown by FIGS. 7A through 11B. FIG. 7A is a plane diagram, or net, showing polyhedron edges, generally indicated by the reference numeral 36, that, when folded about edge lines 38, produces a tetrahedral-shaped structure, generally indicated by the reference numeral 40, shown in perspective by FIG. 7B. FIG. 8A shows a net, generally indicated by the reference numeral 42, that, when folded about edge lines 44, produces a triangular-prism-shaped structure, generally indicated by the reference numeral 46, shown in perspective by FIG. 8B. FIG. 9A shows a net, generally indicated by the reference numeral 48, that, when folded about edge lines 50, produces a hexagonal-prism-shaped structure, generally indicated by the reference numeral 52, shown in perspective by FIG. 9B.

Figure 9A:
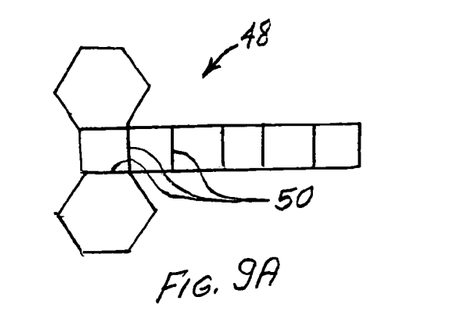
FIG. 9A is a plane diagram, or net, in which edges of faces of a die that is foldable into a hexagonal-prism-shaped structure are shown.
Figure 9B:
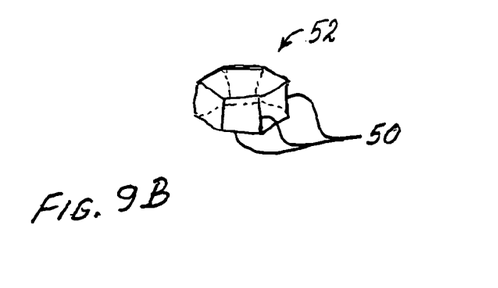
FIG. 9B is a perspective view, shown partially with hidden lines, of the folded hexagonal-prism-shaped structure of FIG. 9A.
Figure 10A:
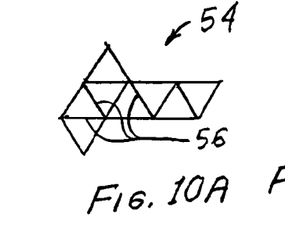
FIG. 10A is a plane diagram, or net, in which edges of faces of a die that is foldable into a triangular-antiprism-shaped, or octahedron-shaped, structure are shown.
Figure 10B:
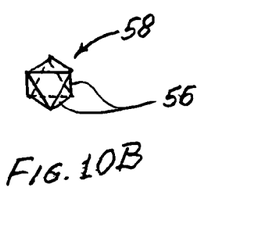
FIG. 10B is a perspective view, shown partially with hidden lines, of the folded octahedron-shaped structure of FIG. 10A.
Figure 11A:
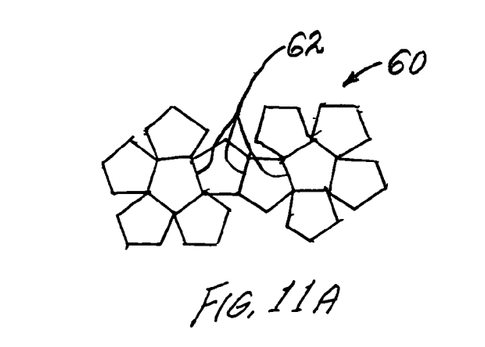
FIG. 11A is a plane diagram, or net, in which edges of faces of a die that is foldable into a dodecahedron-shaped structure are shown.
Figure 11B:
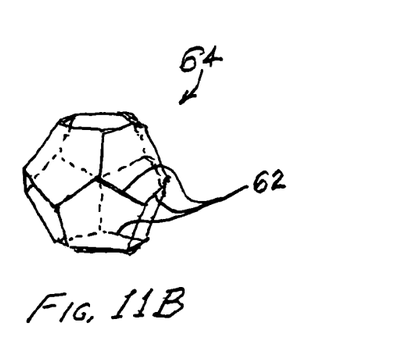
FIG. 11B is a perspective view, shown partly with hidden lines, of the folded dodecahedron-shaped structure of FIG. 11A.

FIGURE 10A shows a net, generally indicated by the reference numeral 54, that, when similarly folded about edge lines 56, produces a triangular-antiprism-shaped, or octahedron-shaped, structure, generally indicated by the reference numeral 58, shown by FIG. 10B. FIG. 11A shows a net, generally indicated by the reference numeral 60, that, when similarly folded about its edge lines 62, produces a dodecahedron-shaped structure, generally indicated by the reference numeral 64, shown by FIG. 11B. FIGS. 7A through 11B illustrate representative examples of a variety of multisurfaced configurations having surfaces that are suitable for supporting energy sensors and transmitters, that are facing in a number of different directions and that extend from a substrate by a centimeter or more. It will be recognized by those skilled in the art to which the subject matter pertains that the multisurfaced configurations are representative and that the use of structures not including all segments of their illustrated configurations are implicitly included.

Figure 12:
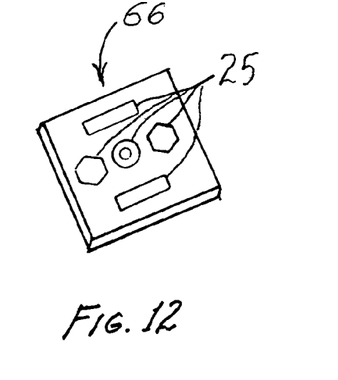
FIG. 12 is a perspective view of a single substrate.
Figure 13:
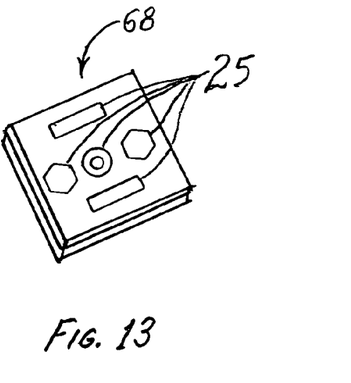
FIG. 13 is a perspective view of a rectangular-prism-shaped structure formed of two joined substrates.
Figure 14A:
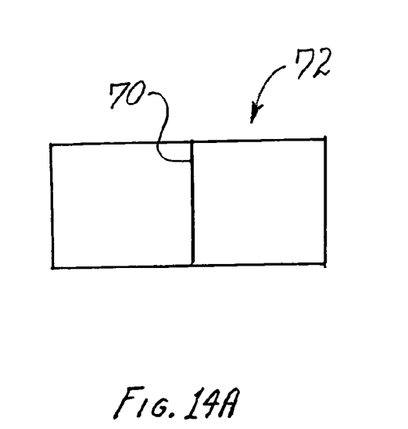
FIG. 14A is a plane diagram, or net, in which an edge between faces of a die that is foldable into a rectangular-prism-shaped structure is shown.
Figure 14B:
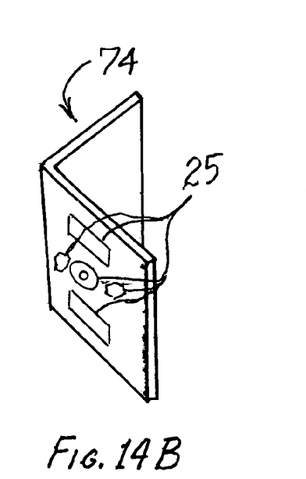
FIG. 14B is a perspective view of the partially folded rectangular-prism-shaped structure of FIG. 14A
Figure 14C:
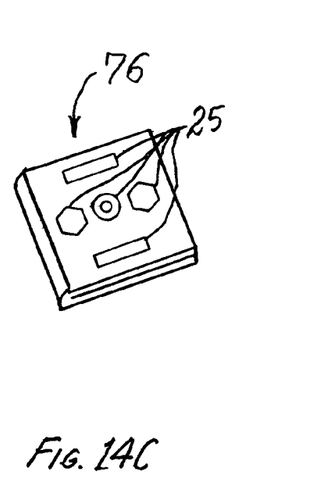
FIG. 14C is a perspective view of the completely folded rectangular-prism-shaped structure of FIG. 14A.

Although the previously described microdevice systems include more than two outer faces, as shown by microdevice systems having microdevices fabricated on one and both surfaces of substrates, as shown by FIGS. 1 through 11B, microdevice systems having microdevices fabricated on one and both opposed outer faces of single and joined substrates also find useful applications individually and cooperatively combined in linear and nonlinear arrays. FIG. 12 illustrates a single substrate 66 that can have microdevices 25 on one or both of its opposing sides. FIG. 13 shows a pair 68 of substrates joined to provide a pair of outer surfaces. FIG. 14A shows a pair 72 of substrates that are joined along line 70 but unfolded. FIG. 14B illustrates a pair 74 of substrates that are joined and partially folded. FIG. 14B shows a pair 76 of substrates completely folded to provide two outer surfaces.

Figure 15:
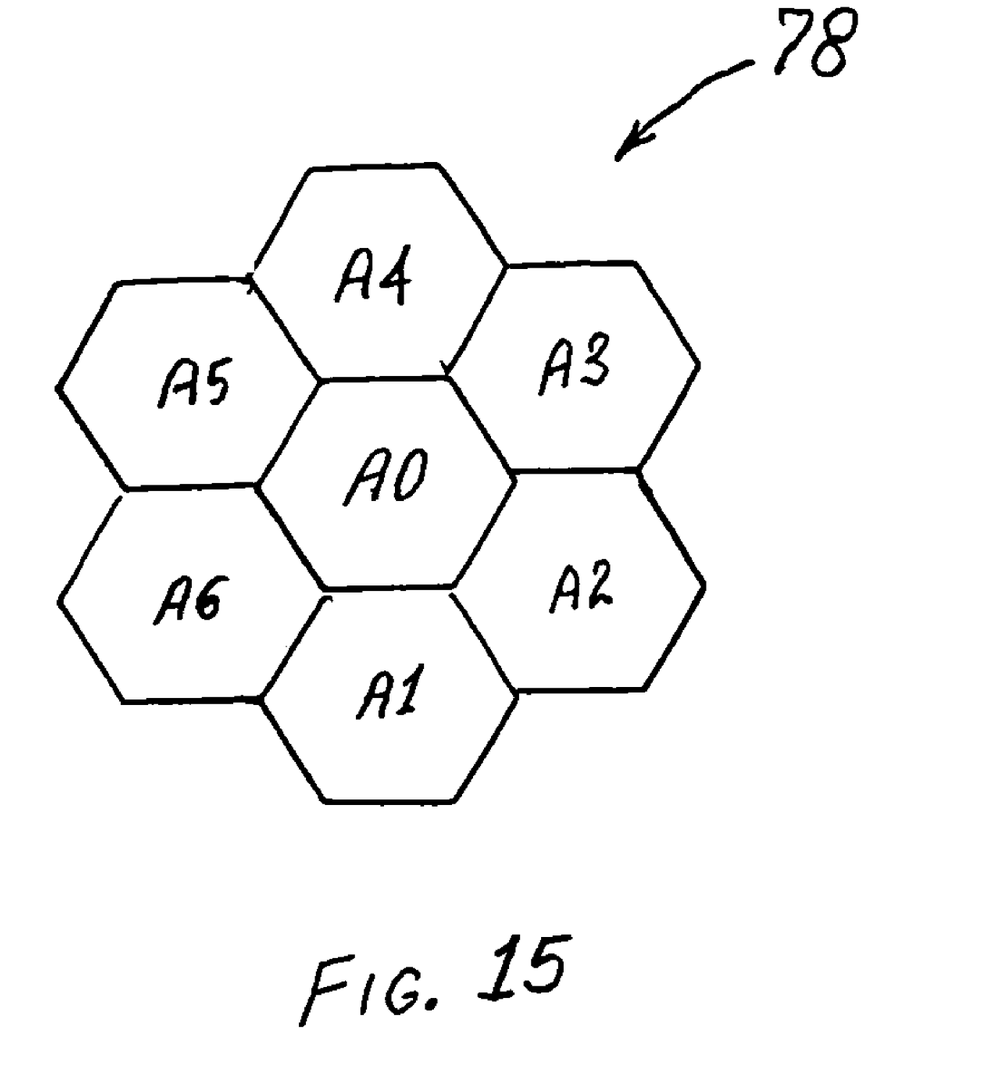
FIG. 15 is a view of seven microdevice systems shown by FIG. 9B and cooperatively combined to form a small array.

FIG. 15 shows seven microdevice systems, such as that 52 shown by FIG. 9B, cooperatively combined to form a small array, generally indicated by the reference numeral 78. In this arrangement, one microdevice system A0 is in contact with each of the six additional microdevice systems A1 through A6. Such an arrangement facilitates communication between each and at least three others of the seven microdevice systems. Although the microdevice systems A1 through A6 are shown clustered contiguously about microdevice system A0, other arrangements are possible; for example, they can be arranged linearly and in partially linear combinations.

Figure 16:
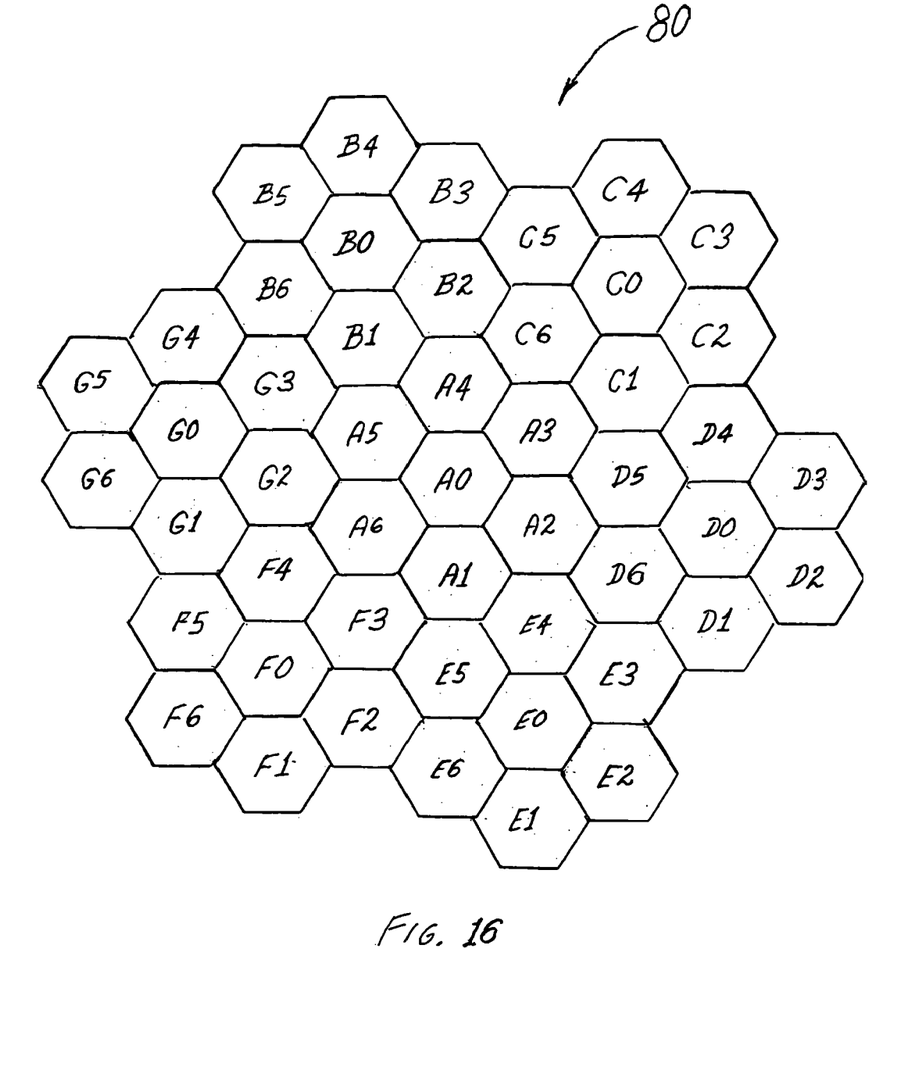
FIG. 16 is a view of 49 microdevice systems shown by FIG. 9B and cooperatively combined to form a larger array.

FIG. 16 shows 49 microdevice systems, such as that 52 shown by FIG. 9B, cooperatively combined to form a larger array, generally indicated by the reference numeral 80. The larger array 80 shown by FIG. 16 includes a set of seven microdevice systems 52, such as A0 through A6 shown by FIG. 15; and this set is surrounded by six additional sets of seven similar microdevice systems, such as B0 through B6, C0 through C6, D0 through D6, E0 through E6, F0 through F6, and G0 through G6. Such an arrangement is but one other example of a microsystem array using microsystems having hexagonal-prism-shaped structures as shown by FIG. 9B. Structures such as those shown by FIGS. 1 through 11B and/or combinations of those and others not shown by the drawing figures are also contemplated, as will be understood by those skilled in the art to which the subject matter pertains. As indicated by FIGS. 15 and 16, arrays of hundreds or thousands of small, light, low-cost, low-power microdevice systems can be readily and economically assembled using such structures to form a universally applicable macro-array to provide a wide variety of integrated sensing, actuating and controlling functions.

An example of an application of an extension of the basic arrays shown by FIGS. 15 and 16 is provided by the previously mentioned U.S. Pat. No. 4,825,062, titled Extendable Large Aperture Phased Array Mirror System. Additional examples of uses to which the extendable arrays of the present invention are applicable are provided by the following U.S. patents:

| | |
|---|---|
| 4,950,878 | Wavefront Control System Using Optical Coarse/Fine Gradient Sensor |
| 6,385,474 | Method and Apparatus for High-Resolution Detection and Characterization of Medical Pathologies |
| 6,450,960 | Real-Time Three-Dimensional Acoustoelectric Imaging and Characterization of Objects |
| 6,540,678 | Real-Time Three-Dimensional Acoustoelectric Imaging and Characterization of Objects |
| 6,672,165 | Real-Time Three-Dimensional Acoustoelectric Imaging and Characterization of Objects |
| 6,728,567 | Method and Apparatus for High-Resolution Detection and Characterization of Medical Pathologies |

It will be understood by those skilled in the art to which the subject matter pertains that a method of producing multisurfaced microdevice systems as represented by FIGS. 1 through 6 is applicable to produce many additional structural configurations, such as those shown by FIGS. 7B through 11B. A method of producing the multisurfaced microdevice system 37 shown by FIGS. 1 through 6 includes locating individual dice 16 within an area of at least one of first and second surfaces, 12 and 14, respectively, of a semiconductor wafer 10. The wafer surface is preferably prepared by methods that include, but are not limited to including, polishing and spinning. Individual face sites are located within each die site to facilitate production of a plurality, that is, more than one, of dice 16 having multifaced configurations. The first surface 12 of each subsequent die 16 forms an outer face 13, and the second surface 14 of each subsequent die 16 forms an inner face 15. The individual face sites are located such that the number of individual wafer cuts are held to a minimum while a maximum number of dice are obtained from the wafer 10. Preferably, a great number of duplicate as well as different sensing, controlling and actuating microdevices 25 that are small, light, economical and suitable for a large variety of applications are fabricated at locations on at least one of the outer and inner faces, 13 and 15, respectively. The microdevices 25 and mechanical interfaces (not shown) are fabricated by microform methods that include, but are not limited to including, epitaxy, lithography, ablation and etching. Direct electrical connections and some electromagnetic radiation passing between microdevices 25 located at opposite sides of the wafer 10 are facilitated by openings passing through the wafer 10. Also, infrared and acoustic energy readily transmits through the wafer material.

One method of maintaining the wafer 10 in position during microdevice fabrication includes using an edge-gripping device (not shown). This method enables the fabrication of microdevices on both sides of the wafer 10. A method for maintaining the wafer 10 in position for microdevice fabrication on its outer surfaces 13 includes securing it to a flat work stage (not shown but known in the art) using such means as vacuum ports or clamps. If this is the method used, the wafer 10 must be inverted and secured to the same or a similar work stage to facilitate the fabrication of microdevices 25 at locations on its inner faces 15.

To avoid damaging fragile microdevices 25 on the outer faces 13 when the wafer 10 is inverted, the microdevices 25 can be fabricated so that all their parts are below the level of the fixing areas 24, which will be in contact with the work stage. In contemporary machines that fabricate microdevices at locations on only one face of a substrate, however, concern for the locations of vacuum ports is limited primarily to the ability of the vacuum to maintain the wafer 10 in position during microdevice fabrication; and the pattern of vacuum port locations can vary. To avoid the expense of retooling work stages to accommodate a standard pattern of vacuum ports, one approach is to compile a detailed computer record of precise vacuum port locations of every work stage used in every production line. These data would then be incorporated into software algorithms used to lay out microdevices 25 on both substrate faces, 13 and 15, to ensure an alignment of fixing areas 24 between the microdevices 25 with vacuum port locations in the work stages.

In a more preferred method, a protective coating is first applied to the outer faces 13 and to the plurality of microdevices 25 disposed there. The protective coating is preferably transparent to visible and infrared light to facilitate the precise locating of microdevice elements for applications of external references and connections and to enable transmissions of energy and data using such means as LED's. The protective coating has sufficient flatness, for example, by having been spun, thickness and hardness to enable fixing the semiconductor wafer in a precise position to facilitate fabricating microdevices 25 at precise locations on the inner faces 15 while preventing coincident damage to the microdevices at locations on the outer faces 13. Each die 16 is then separated from all other dice 16, by methods such as cutting, deep etching, cleaving along crystal axes, laser or particle beam ablation or breaking, to form a plurality of square and rectangular substrates, 20 and 22, respectively.

At least one of the rectangular substrates 22 is oriented to extend from at least one of the square substrates 20 to form a multidimensional structure having a multifaced configuration. The substrates are bonded along their lines of abutment, if required to rigidify the resulting structure, by methods that include, but are not limited to including, laser fusion and the application of contact cement. Those skilled in the art to which the subject matter pertains will appreciate that, rather than cutting or breaking a substrate to separate dice 16 from other dice from which they are to extend and then reattaching them, it is sometimes more advantageous to bend dice 16 into required configurations, especially when required extension angles are relatively small. Bent as well as abutted edges are bonded, if additional rigidity is required, to maintain structural orientation. Those skilled in the art to which the subject matter pertains will also appreciate that many of the previously described operations can be performed by employing extensions of existing, standard, low-cost microelectronic manufacturing techniques and that others can be integrated in specialized fabrication machines. Three-dimensional manufacturing and post-assembly additions and modifications can readily be accomplished by using, for example, an excimer laser. Such a laser can also be used to form precise channels in a substrate to function as waveguides for optical and other high frequency transmissions, as beam splitters and as beam tapers. The plurality of substrates, 20 and 22, and the plurality of microdevices 25 form a microdevice system 37 wherein the microdevices 25 have the capability of communicating operating energy and data to each other. Various orientations of the dice 16 align the microdevices 25 along a large number of respective axes.

An example of a microdevice system 37 constructed using the described method is a generic guidance and control device. Microdevices 25 at locations on at least one of the outer faces 13 of a plurality of substrates include such elements as acoustic sensors, light-sensing, charge-coupled devices (CCD's) for visual imaging, micromotors, accelerometers, and position and angular rate sensors. Locations on inner faces 15 can include at least one microprocessor 35 and electric circuitry 29. Contacts and plugs (not shown) can also be positioned at locations on the inner faces 15 and outer faces 13 for the input and output of electric energy, control signals and data. Alternatively, at least some of these functions can be provided using noncontact methods such as acoustic emitters and receiver and electromagnetic energy emitters and receivers, including light-emitting diodes and photoreceptors.

A plurality of the microdevice systems 37 are cooperatively combined to form a microdevice system array. Depending on specific application requirements, an operational array includes a few or an enormous number of microdevice systems. As shown by FIGS. 7A through 11B, there are numerous possible structural configurations for microdevice systems. FIG. 9B, for example, shows a hexagonal-prism-shaped structure; and FIGS. 15 and 16 show a small and a larger array, 74 and 76, respectively, formed of these system structures. A specific microdevice system array comprises a standard complement of microdevices 25 to provide economical and efficient redundancies to perform a plurality of functions some of which require specific orientations provided by angled surfaces of the multifaced microdevice systems 37.

It should be noted that the steps of included claims need not be in the sequence shown and that some steps might be performed simultaneously, for example, fabricating microdevices on opposite sides of the substrates, and, for example, providing energy transferring apparatuses.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of constructing a multisurfaced microdevice system array, the method comprising the steps of:

providing a plurality of semiconductor substrates each having a first and a second surface;

fabricating a plurality of sensing, controlling and actuating microdevices at locations on at least one of the first and second surfaces of the plurality of substrates;

orienting at least one of the substrates to extend from another substrate to form a multisurfaced structure having a multifaced configuration including at least two outer faces and at least two inner faces, the plurality of substrates and microdevices forming a microdevice system; and disposing a plurality of the microdevice systems to form a readily extendable microdevice system array, each microdevice system of the array having the capability of communicating operating energy to at least one other microdevice system via at least one of micromechanical linkages, fluidic ducts, electric conductors, contacts and plugs; electromagnetic and acoustic emitters and receivers; and electromagnetic waveguides and data to at least one other microdevice system via emitters and receivers for transferring electromagnetic energy, the array providing economical and efficient redundancies of microdevices to perform a plurality of functions, some of which require specific microdevice orientations provided by angular dispositions, including a straight angle of 180 degrees, of the surfaces of the multifaced microdevice systems.

2. A method of constructing a multisurfaced microdevice system array, the method comprising the steps of:

provifing a semiconductor wafer having a first and a second side;

locating individual die sites within an area of at least one of the first and second surfaces of the wafer;

locating individual face sites within each die site to facilitate production of a plurality of dice having multifaced configurations, the first surface of each subsequent die to form an outer face, the second surface of each subsequent die to form an inner face;

fabricating a plurality of sensing, controlling and actuating microdevices at locations on at least one of the outer and inner faces;

separating each die from all other dice to form a plurality of substrates;

orienting at least one of the substrates to extend from another substrate to form a multisurfaced structure having a multifaced configuration, the plurality of substrates and the plurality of microdevices forming a microdevice system; and disposing a plurality of the microdevice systems to form a readily extendable microdevice system array, each microdevice system of the array having the capability of communicating operating energy to at least one other microdevice system via at least one of micromechanical linkages, fluidic ducts, electric conductors, contacts and plugs; electromagnetic and acoustic emitters and receivers; and electromagnetic waveguides and data to at least one other microdevice system via emitters and receivers for transferring electromagnetic energy, the array providing economical and efficient redundancies of microdevices to perform a plurality of functions, some of which require specific microdevice orientations provided by angular dispositions, including a straight angle of 180 degrees, of the surfaces of the multifaced microdevice systems.

3. The method as defined by claim 2, wherein the microdevices fabricated at locations on each of the outer and inner faces have a root mean square linear displacement accuracy within 75 nanometers and have a root mean square angular displacement accuracy within 75 nanometers to facilitate the transfer of energy through empty space and through the substrate to operate, and to communicate data to, other microdevices.

4. The method as defined by claim 2, wherein microdevices are fabricated at locations on both the outer and inner faces, and the registration of the microdevices located at the inner faces and of the microdevices located oppositely at respective outer faces is typically accurate to within 0.10 millimeter to facilitate the transfer of energy through empty space and through the substrate to operate, and to communicate data to, other microdevices.

5. The method as defined by claim 2, wherein the step of fabricating a plurality of microdevices at locations on at least one of the outer and inner faces comprises the steps of:

fabricating a plurality of the microdevices at locations on at least one of the outer faces;

applying a protective coating to the outer faces and to the plurality of microdevices fabricated at locations on the outer faces, the protective coating having sufficient flatness, thickness and hardness to facilitate fixing the semiconductor wafer in a specific position to facilitate fabricating microdevices at precise locations on the inner faces while preventing coincident damage to the microdevices at locations on the outer faces; and fabricating a plurality of the microdevices at locations on at least one of the inner faces.

6. The method as defined by claim 5, wherein the step of applying the protective coating comprises applying a material that is transparent to visible and infrared light, thereby facilitating the precise locating of microdevice elements.

7. The method as defined by claim 1, further comprising fabricating a plurality of sensing, controlling and actuating microdevices disposed at locations on the second surface of the at least one substrate.

* * * * *